United States Patent
Fischetti

(10) Patent No.: US 6,337,523 B1
(45) Date of Patent: Jan. 8, 2002

(54) AUTOMATED OPERATION OF SILICON CONTROLLED RECTIFIER SWITCHES USING SENSORS SUCH AS SCHMITT DEVICES

(75) Inventor: Peter Paul Fischetti, Troy, NY (US)

(73) Assignee: Troy Video Recording Services, Inc., Troy, NY (US)

( * ) Notice: Subject to any disclaimer, the term of this patent is extended or adjusted under 35 U.S.C. 154(b) by 0 days.

(21) Appl. No.: 09/501,671

(22) Filed: Feb. 10, 2000

(51) Int. Cl.$^7$ .............................................. H01H 35/00
(52) U.S. Cl. ...................................... 307/116
(58) Field of Search .................. 307/112, 113, 307/116, 125, 128, 130, 131, 138, 171.4, 132 E, 132 EA

(56) References Cited

U.S. PATENT DOCUMENTS

| | | | |
|---|---|---|---|
| 2,767,330 A | 10/1956 | Marshall | 307/130 |
| 3,746,951 A | 7/1973 | Hohman | 318/221 E |
| 3,764,822 A | 10/1973 | Ebbinge et al. | 307/141 |
| 3,832,612 A | 8/1974 | Woods | 318/221 |
| 3,846,648 A | 11/1974 | Scott | 307/293 |
| 3,903,476 A | 9/1975 | Gawron et al. | 323/22 SC |
| 3,942,086 A | 3/1976 | Bresler | 318/447 |
| 4,163,999 A | 8/1979 | Eaton et al. | 361/23 |
| 4,204,149 A | 5/1980 | Cleary et al. | 323/24 |
| H246 H | 4/1987 | Banura | 318/480 |
| 4,674,023 A | 6/1987 | Peppel et al. | 363/57 |
| 4,767,974 A | 8/1988 | Kadosawa | 318/663 |
| 5,331,262 A | 7/1994 | Francisco | 318/452 |
| 5,391,971 A | 2/1995 | Yamada et al. | 318/778 |

FOREIGN PATENT DOCUMENTS

| | | | |
|---|---|---|---|
| JP | 60-254207 | 12/1985 | G05B/24/02 |
| JP | 63-129878 | 6/1988 | H02P/5/00 |
| JP | 64-69280 | 3/1989 | H02P/3/12 |
| JP | 2-303383 | 12/1990 | H02P/1/22 |
| SU | 775814 | 1/1980 | |

OTHER PUBLICATIONS

Forrest M. Mims III, "Engineer's Mini–Notebook, Basic Semiconductor Circuits," Radio Shack Cat. No. 276–5013, First Edition 1986–1987, pp. 46–47.

*Primary Examiner*—Edward H. Tso
(74) *Attorney, Agent, or Firm*—Kevin P. Radigan, Esq.; Heslin Rothenberg Farley & Mesiti P.C.

(57) ABSTRACT

Circuits for automated operation, including automated reset, of switches are disclosed. Preferred embodiments of the switches of the invention include silicon controlled rectifier switches. The silicon controlled rectifier switches are automatically reset, while, in one embodiment, maintaining activation of a target system to which they are connected. The automated reset is effected using an alternate current path, connected to the current path between the target node and the system, upon sensing an event. The alternate current path draws current away from the common node, thereby resetting the switch while maintaining the current path through the target system to maintain the activation thereof. Upon a subsequent event, the alternate current path is removed, thereby deactivating the target system. The alternate current path can be effected using sensors, such as Optoschmitt sensors. Other embodiments include resetting the switch by independently deactivating the target system. Related circuits, including liquid tank flush/refill applications, are also disclosed.

42 Claims, 7 Drawing Sheets

AUTOMATED OPERATION OF SILICON CONTROLLED RECTIFIER SWITCHES USING SENSORS SUCH AS SCHMITT DEVICES

TECHNICAL FIELD

The present invention relates to control systems using switches. More particularly, the present invention relates to automated activation and reset of silicon controlled rectifiers using sensors such as Optoschmitts, and other related circuits.

BACKGROUND OF THE INVENTION

Many products operate with control systems that use microprocessors or mechanical switches. In an effort to control an event or process, mechanical switches are manufactured with various styles of actuators attached which, when depressed, act to regulate power or send a signal to the microprocessor. With this type of switch, not only is there physical contact but the switch itself must be mounted and actuated with some degree of precision to operate efficiently.

Microprocessors are useful in process control but require programming and additional hardware—an interface—to give them the capacity of controlling high voltage devices.

There is a way to effectively control events and processes and eliminate the problems mentioned above by using a silicon controlled rectifier ("SCR") or thyristor.

Thyristors or silicon controlled rectifier switches can be used as a substitute for mechanical switches. SCRs, however, often require a manual reset after they have activated a target system (e.g., motor or relay), or additional circuitry to achieve reset. This manual reset has previously taken the form of a manual push button.

Improved circuits are therefore required which decrease the reliance on mechanically-activated and reset switches, and which capitalize on sensors which can automatically control electrical switches and other devices such as SCRs upon certain sensed events.

SUMMARY OF THE INVENTION

The shortcomings of the prior art are overcome, and additional advantages are provided, by the present invention which in one aspect is a control system for a target system coupled with a power source. A resettable switch is coupled between the target system and a current source/sink. A current sourcing/sinking device (e.g., an Optoschmitt sensor) is commonly coupled with the target system and the resettable switch at a common node. A sensing of a first event activates the switch to thereby activate the target system by causing a flow of current from the power source through the target system and the switch. A sensing of the second event causes the output of the current sourcing/sinking device to draw current from the target system, thereby continuing the flow of current through the target system. The drawing of current by the output of the current sourcing/sinking device from the target system removes the flow of current through the switch thereby automatically resetting the switch while the target system remains activated.

A sensing of a third event inactivates the target system by causing the output of the current sourcing/sinking device to remove the current drawn from the first terminal of the target system, thereby removing the flow of current through the target system.

In exemplary embodiments, the current sourcing/sinking device comprises an Optoschmitt sensor, and the resettable switch comprises a thyristor or a silicon controlled rectifier resettable by the removing of current therethrough.

The target system could comprise a relay for driving higher voltage devices.

In an alternate embodiment of the present invention, a single resettable switch initiated by a single event activates a plurality of target systems, each of the target systems then operable using its own, respective current sourcing/sinking device for removing current drawn therefrom upon subsequent, respective future events. This arrangement is useful when the power to each target system is to be determined at different times. If these events are to be turned off at the same time, a single Optoschmitt sensor can be used. In this arrangement, the power to the devices (assuming they operate on the same voltage) can be tied together and drawn from a single relay. The single relay can then provide power to several devices using one SCR and one relay.

In this regard, the present invention is both a system and a method for resetting a switch resettable by the removal of current therefrom, wherein the switch is used to activate a target system by providing a first current path therefrom. The current sourcing/sinking device (e.g., an Optoschmitt sensor) is used to supplant the first current path with an alternate current path thereby resetting the switch while maintaining activation of the target system. The target system continues to operate, even though the thyristor has been reset, until the Optoschmitt sensor has been deactivated.

Other embodiments of the control system of the present invention are also disclosed, including a method and control system for operating a target system requiring a current path therethrough. A first state of the Schmitt device is used to source/sink the current path to activate said target system; and a second state of the Schmitt device is used to sink/source the current path to deactivate the target system.

Finally a water tank flush/refill application of the principles disclosed herein is presented.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENT(S)

The present invention in one aspect involves the use of sensors and resettable thyristor or silicon controlled rectifier ("SCR") switches, which are reset after a first event is sensed, by using one of the sensors upon a second event. Advantageously, the switch is reset while maintaining the activation of the target system, thereby eliminating the need for a manual reset.

An SCR is a three-terminal device which functions as a true "on/off" switch and has several advantages when compared to other transistors. A momentary voltage applied to the gate terminal will cause the SCR to conduct current through its anode and ground terminals. Current through the switch remains latched until, e.g., a normally-closed mechanical switch is pressed (in the conventional approach), causing current flow to stop by interrupting the ground connection. The SCR is a valuable device since a small voltage applied to its gate terminal can switch much higher voltages.

Figure 1:
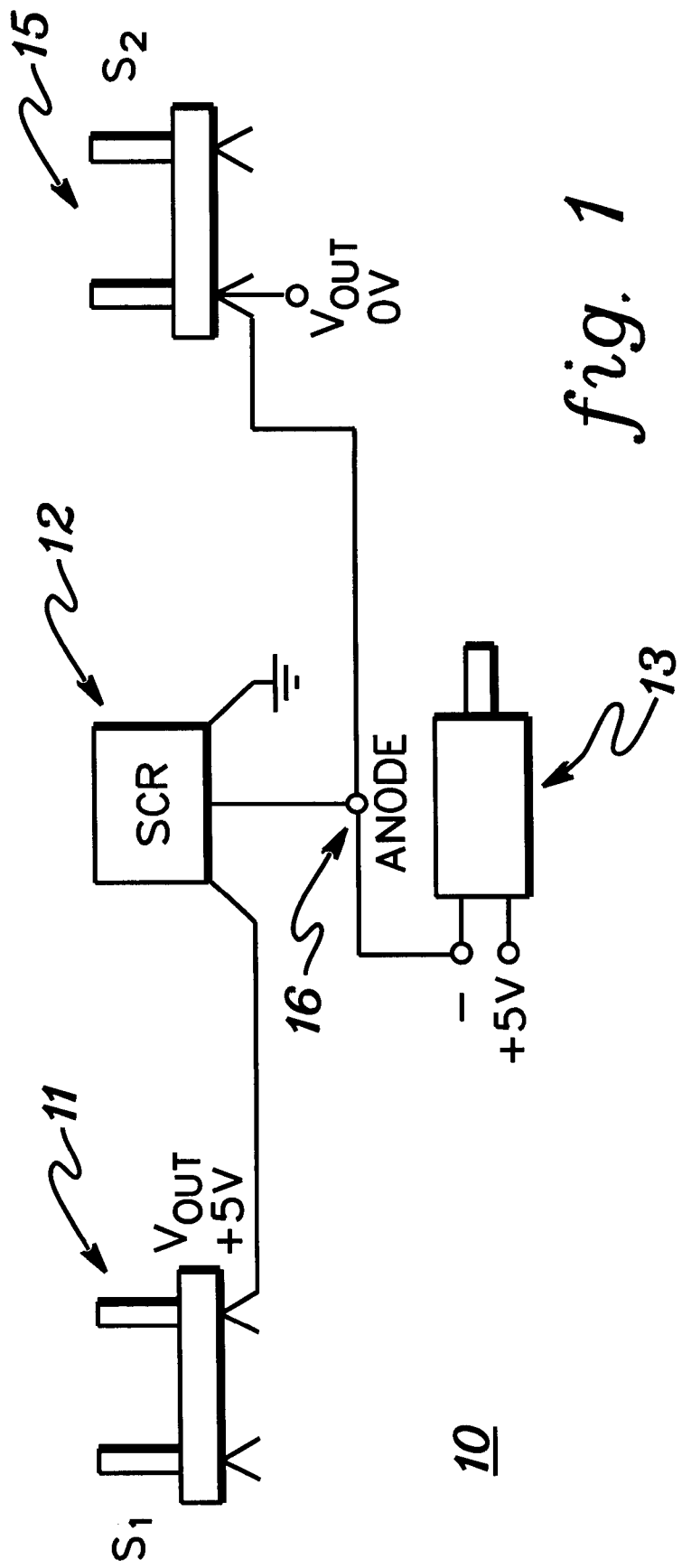
FIG. 1 is a first embodiment of the present invention in which an exemplary Optoschmitt sensor is used to reset a silicon controlled rectifier switch while maintaining activation of a target motor.

With reference to the control system 10 of FIG. 1, infrared sensor 11 is employed to initially activate target system 13 (e.g., a DC motor) by applying a gate voltage to SCR 12 upon the sensing of a first event. Sensor 11 is of the type that outputs +5 volts when an opaque object is placed in the slot area of the device, e.g., a Honeywell, Inc., HOA-1877-2. The sensor used to reset the SCR upon sensing a second event is a current source/sink device, e.g., an Optoschmitt device that outputs 0 volts or ground when its slot area is interrupted. When the slot area is cleared, it outputs +5 volts, e.g., the Honeywell, Inc., HOA-2003-1. The sensor 15 is commonly connected to node 16 with the SCR 12 and target system 13.

When sensor 11 becomes only momentarily interrupted, the sensor makes a low to high transition outputting +5v to the gate terminal of the SCR. This triggers the SCR and causes the motor 13 to rotate based on the current path established from the power source through motor 13 and SCR 12. The SCR (e.g., SK 3596) and the current running through it remain latched, causing rotation of the motor until sensor 15 is interrupted. When this occurs, the sensor 15 accomplishes two things: first, as the opaque object is placed in the slot, the sensor switches to a ground state, drawing current from the anode terminal 16 of the SCR and causing it to reset; and second, and more importantly, at this same instant, it takes over operating the motor until the opaque object "leaves" the slotted area, by supplanting the current path through the SCR with its own current path from the target system 13, across node 16, and into sensor 15. This effect is important in motion control where events must occur in a cycle.

In the preferred embodiment of sensor 15 as an Optoschmitt device, because its diode is buffered by an internal circuit, this sensor can drive any DC device that consumes less than about 40 milliamps of current. This fact has important ramifications since there are relays now available that operate on less than 40 milliamps but have the capacity of controlling up to 10 amps of current. The Honeywell Optoschmitt was previously thought to sink only up to about 16 milliamps and thus would not be a possible inclusion in these various circuit designs.

The addition of the Optoschmitt solves the problem of having to push a button to end motor rotation while resetting the SCR for cyclical operation. The addition of a relay into the target system, (e.g., Omron G6B-1174) can allow for the effective control of higher voltage motors or devices.

Figure 2:
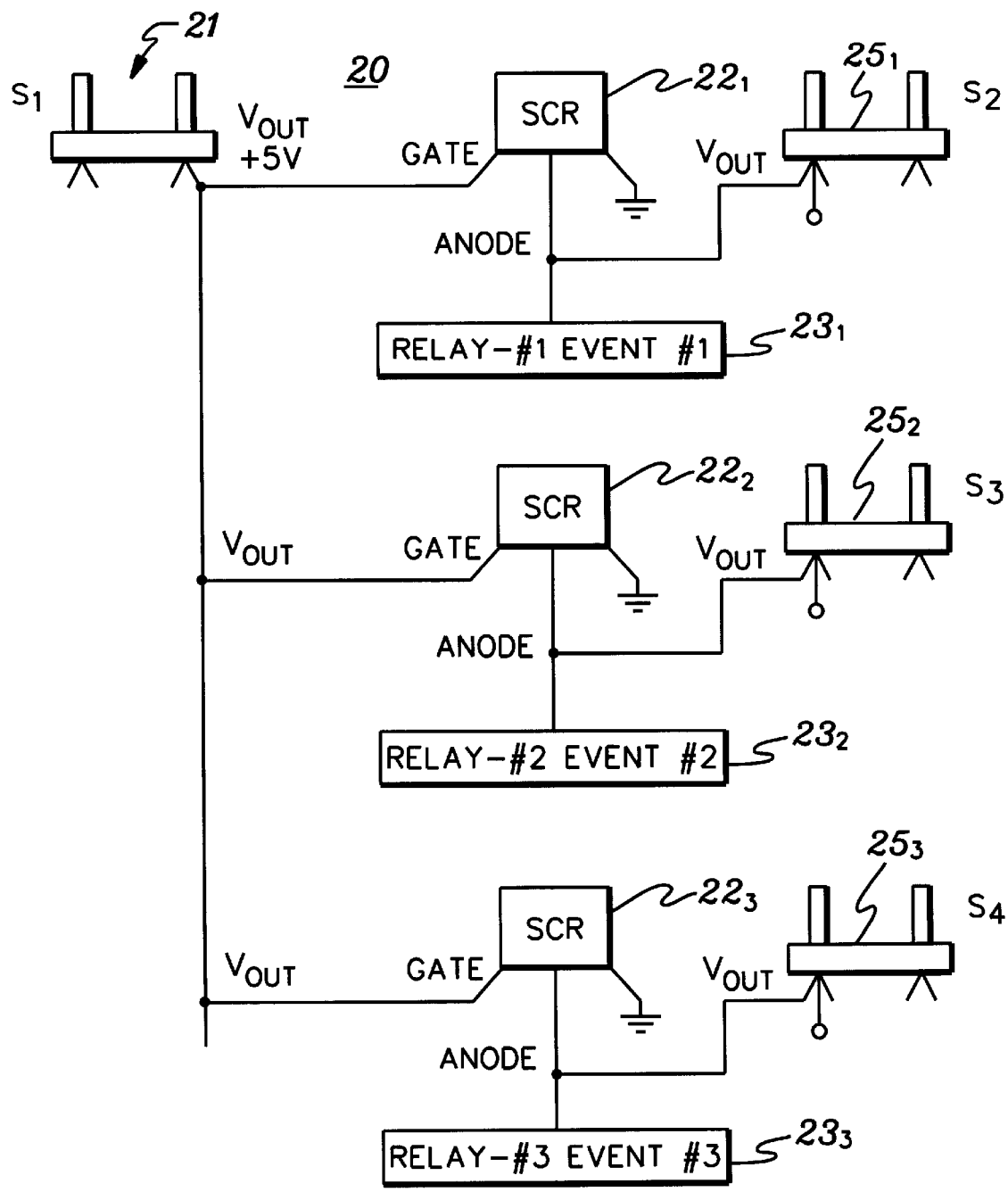
FIG. 2 is an alternate embodiment of the present invention in which a single sensor activates multiple SCR switches, thereby activating multiple target systems, each of which is thereafter controlled and reset by respective Optoschmitt sensors.

In addition, many adaptations of this circuit can be constructed depending upon the requirements of the event. For example, any sensor that outputs a voltage higher than 0.8 volts will trigger the SCR and only one sensor of this type is needed to initiate several target systems, as shown in the system 20 of FIG. 2.

This system is useful when several events must start simultaneously but terminate at different times. This is often the case where a timer is used to drive a cam to control some process. Consider, for example, a coin-operated bank. The HOA 1877-2 was chosen as an exemplary sensor 21 because of its wide aperture area. This device can be used to detect any coin that travels through its slot and triggers several events as mentioned above. Once the coin is detected, a direct current motor could be turned on and made to rotate a table. SCR $22_1$ is involved with this aspect of the process. SCR $22_2$ could be responsible for turning on lights, for example, while SCR $22_3$ could control sound effects. Figures could be affixed to this table and be made to move about. The table can be adapted to terminate the three events, by placing an opaque tab on the table and mounting the three respective Optoschmitts $25_{1-3}$ at respective points when the three events should be terminated. When the tab interrupts the Optoschmitt responsible for table motion, it resets the SCR $22_1$ and drives the relay until the table has been returned to its original position. The system is now ready to be triggered by another coin.

Figure 3:
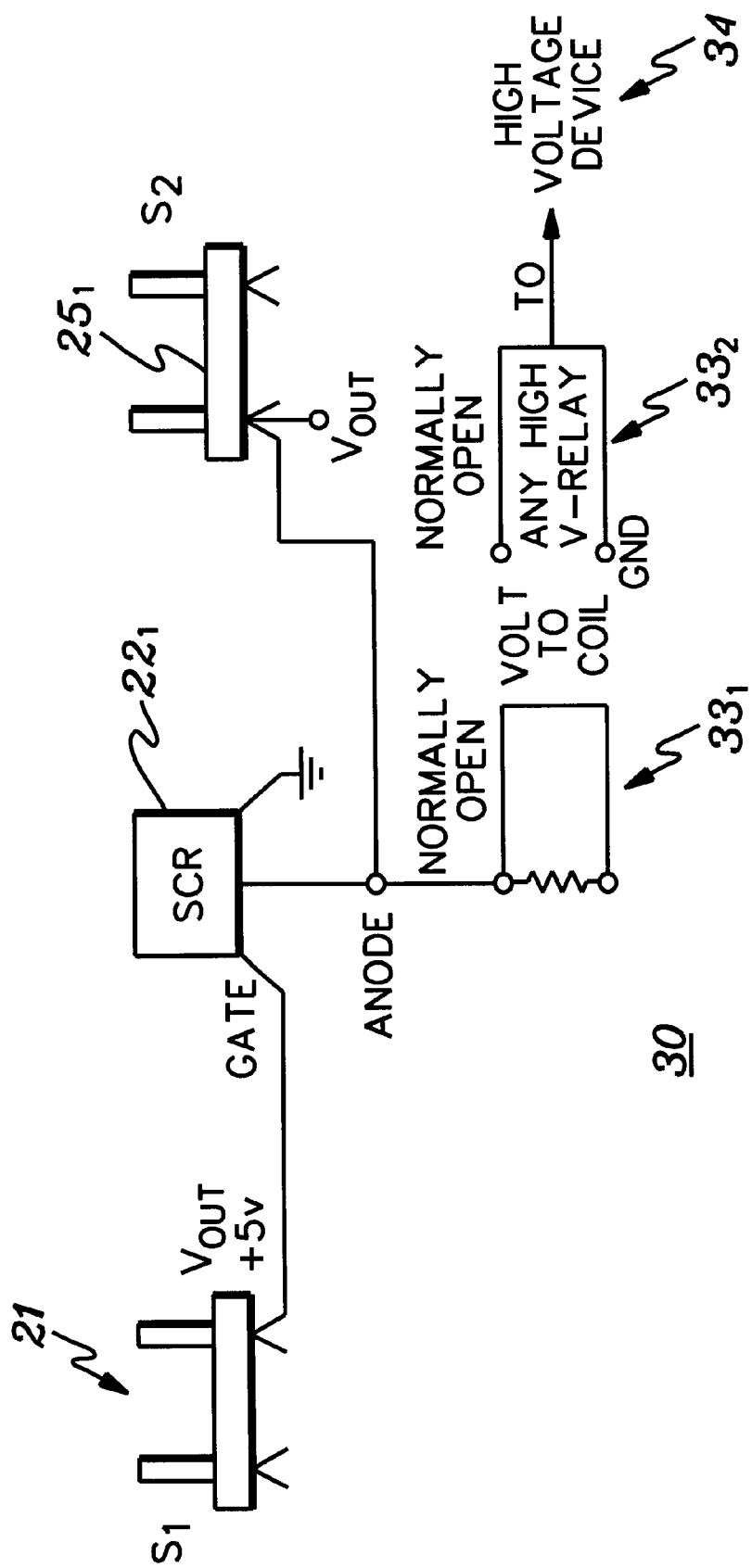
FIG. 3 is another alternate embodiment of the present invention incorporating two relays to facilitate control of a higher voltage device.

In systems that require the control of a high voltage device 34, two relays $33_1$ and $33_2$ can be incorporated in the target system, as shown in the system 30 of FIG. 3. The operation of such an arrangement of relays is known to those skilled in the art to effect proper operation of device 34.

Another useful arrangement of these components involves the use of a normally-closed relay instead of the normally-open type described above.

Figure 4:
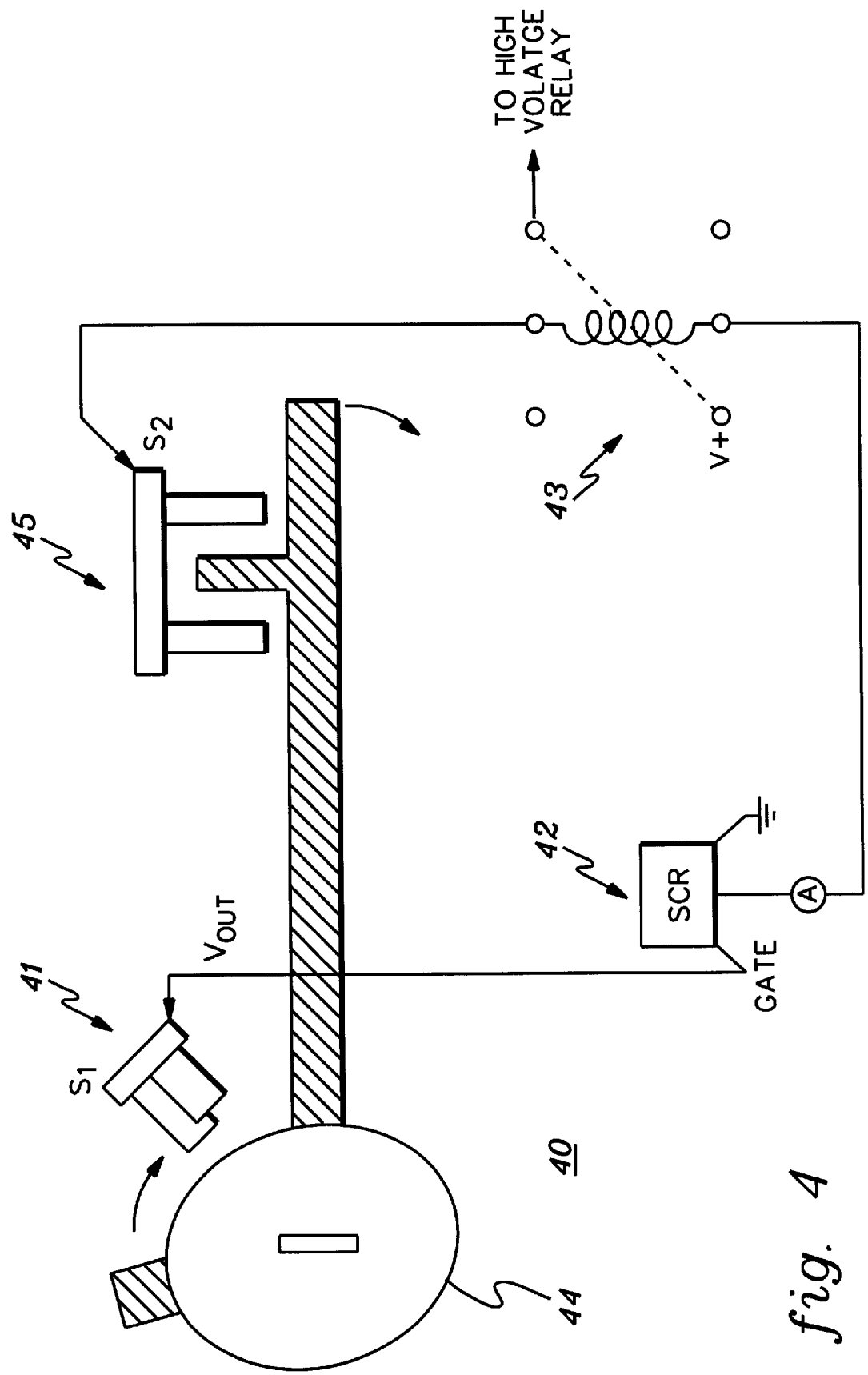
FIG. 4 is another alternate embodiment of the present invention in which the states of two sensors used must be correct to power the system.

Another useful arrangement of these components involves the use of a normally open relay 43 where the trigger sensor (S1-Honeywell HOA 1877-1 or -2) is normally uninterrupted and the reset sensor (S2-HOA 2003-1 Optoschmitt) is normally interrupted. With reference to FIG. 4, this system 40 is useful in controlling an event by preventing SCR 42 from resetting until the sensor 45 becomes uninterrupted. The circuit is shut down and will not operate until the opaque object leaves S2's slotted area When a key is turned in rotating cam 44, S2 45 becomes uninterrupted (first event) providing the positive voltage to relay R1 43. Now, the relay needs a ground connection to be turned on. As cam 44 further rotates, S1 41 becomes momentarily interrupted (second event) triggering SCR 42 and providing the ground connection to relay 43. This acts to turn on relay 43 providing voltage to a device or high voltage relay. The system is reset when sensor 45 again becomes interrupted (third event), as cam 44 rotates back to its original position. This arrangement is useful in systems where two conditions (i.e., the first and second events) must be satisfied before an event can occur, particularly in automobile ignition systems where there is a need for security.

Figure 5:
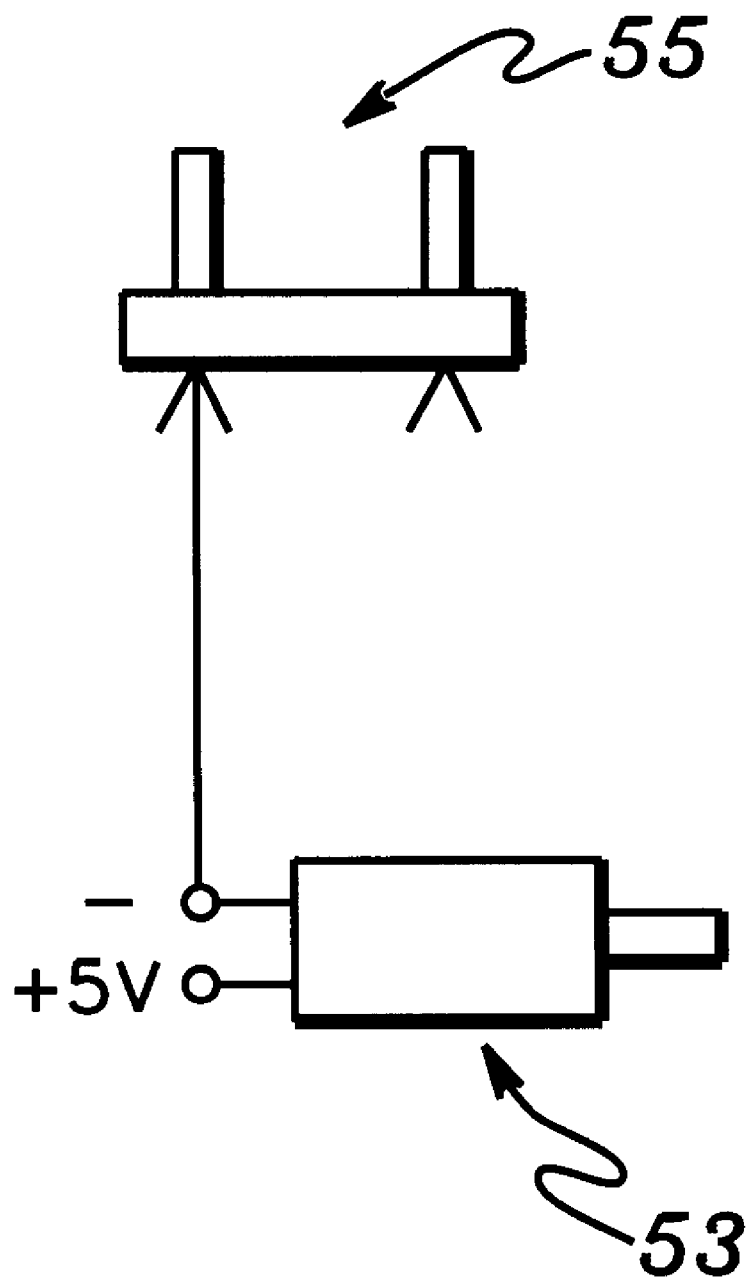
FIG. 5 is another alternate embodiment of the present invention in which an Optoschmitt device is used to activate and deactivate a target system.

Another embodiment of the invention is depicted in FIG. 5. This circuit requires only one sensor 55, with current/voltage sinking ability, such as that provided by an Optoschmitt device. The output of the sensor 55 is coupled to the cathode of the target device 53, whose anode is coupled to a power supply. The target device 53 is in an "off" condition until the sensor 55 is activated, since the non-activated state for the sensor 55 of providing high voltage potential at the output of the sensor 55 prevents current from flowing from the power supply. Then, when the sensor 55 is activated, the current/voltage sink at the output of the sensor 55 causes current to be drawn from the power supply, through the motor 53, and to the output of the sensor so the motor device is "on." As an alternative, the output of the sensor 55 could be reconfigured or inverted, so the normal condition of the target device 53 would be "on" when the sensor 55 is deactivated, and then the target device 53 would be switched "off" upon activation of the sensor 55. A relay may comprise the target device 53, where the relay may in turn be coupled to a motor requiring a relatively high voltage. The Optoschmitt is generally limited to working with 40 mA at its output; so a motor requiring less than 40 mA may serve as the target device 53, or a relay could be activated to run a motor at a higher level. Thus, the term "activated" when used herein connotes a desired state of operation of the target device, regardless of whether the state comprises actual operation of a system or an idle state of the system.

Since the output of the sensors is TTL, the systems disclosed herein can be linked with microprocessor control. Since the events can be controlled without the use of a microprocessor, this system greatly reduces the design of interfaces and the need to configure software. The microprocessor can serve to monitor the events controlled in larger processes by noting when the process being controlled has started and ended. The high and low output of these sensors can be sent to a data latch like the one manufactured by Texas Instruments, their 74ALS574 device, and read by the microprocessor.

Figure 6:
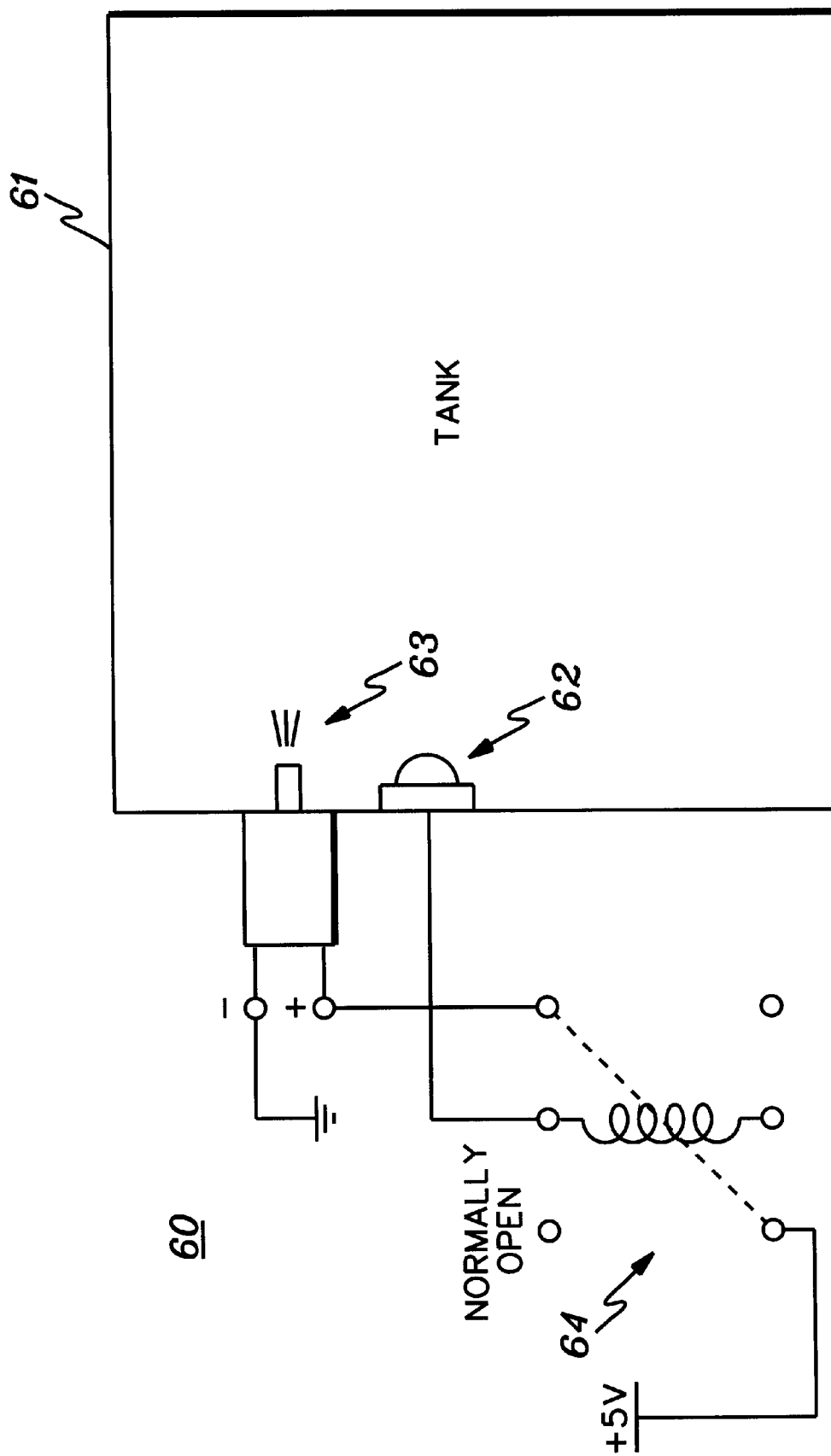
FIG. 6 is an embodiment of the present invention in which sensors are used to maintain liquid level in a tank.

One modification of the principles disclosed above involves system 60 of FIG. 6 which maintains a constant fluid level in a tank 61. A sensor 62 is mounted in the tank 61 to control a valve 63 through a normally closed relay 64. When the liquid level falls below the sensor's dome—due to evaporation—the sensor 62 switches to a "High" (+5 v) state, turning off relay 64. When this occurs, current flows to, and turns on, the valve 63 until the desired liquid level has been re-established. Because the positive terminal of the valve 63 is wired through the normally-closed contacts of the relay 64, the sensor 62, manufactured by Honeywell Inc. is equipped with the Schmitt output. This arrangement could be useful for swimming pools, etc. to prevent impeller pumps from burning out.

Figure 7:
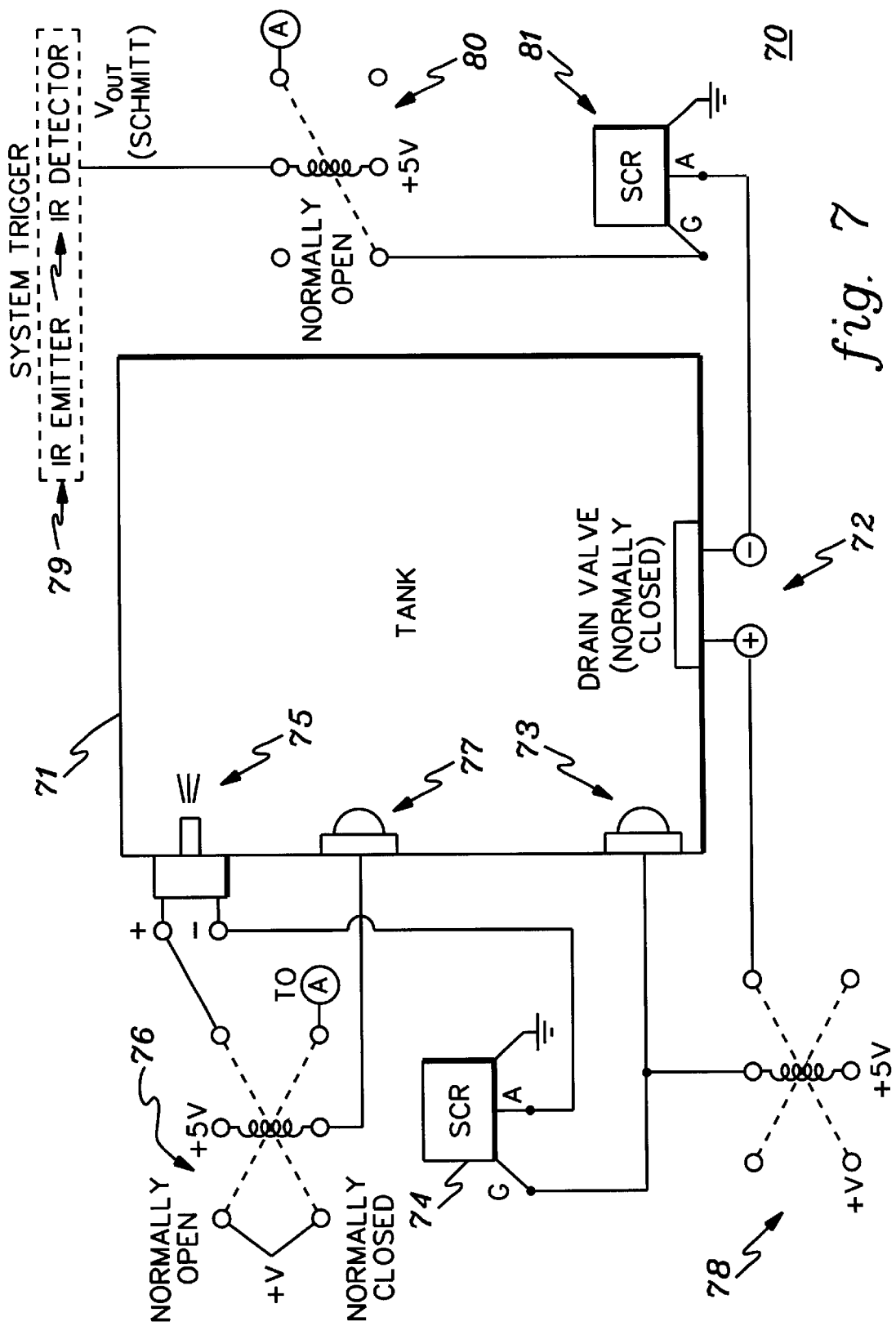
FIG. 7 is an improved embodiment of the circuit of FIG. 6 in which multiple sensors are use to flush and refill the liquid in a tank.

Another modification of the principles discussed above involves system 70 of FIG. 7 in which sensors, valves and other components are used to automatically flush and refill a liquid tank 71.

Operation of this circuit begins when power is initially applied. At this point, the tank is empty and the drain valve 72 is closed. Sensor 73—located at the bottom of the tank—is at a "High" potential since there is no liquid in the tank. This high (+5 v) state triggers the gate of SCR 74 setting up the ground connection for the refill valve 75 located at the top of the tank. The positive voltage needed for the refill valve to operate comes from the normally-closed contacts of relay 76. Relay 76 is controlled by sensor 77. Since this liquid-level sensor is also at a "high" potential, relay 76 is in the off state causing current to flow to the refill valve 75.

Since the tank is now being refilled, it is necessary to disable the drain part of the circuit to prevent the drain from opening while the tank is being refilled. This is accomplished by applying voltage to the normally-open and normally-closed contacts of relay 76. When sensor 73 is high and there is no liquid touching the sensor's dome, relay 76 is off and there is not current available for triggering the drain valve from opening (discussed further below). In other words, the drain part of the circuit can only operate when sensor 77 is at a low state, when it is covered with liquid.

So, as the tank is refilling, it will continue until sensor 77 switches low. When this occurs it causes SCR 74 to reset by stopping current to flow through the anode terminal of SCR 74.

Now, with the tank full, current is available from the normally-open contacts of relay 76 to start the flush/refill cycle. The system will operate each time one cycle is completed by the interruption (manual) of an IR emitter/detector pair in system trigger 79. The emitter and detector are spaced so that one's finger can cause the interruption to initiate the series of events to flush/refill the tank.

The interruption of trigger 79, with its Schmitt output, causes relay 80 to close its normally-open contacts. With current available from relay 76 through node A, SCR 81 is triggered, making the ground connection for the drain valve. The positive voltage for the drain valve is controlled by sensor 73 and relay 78. Since the tank has liquid in it or is in the full condition, sensor 73 is low, turning on relay 78 and providing voltage to the drain valve or pump, if desired. The liquid will drain from the tank until sensor 73 switches high or when there is no liquid touching the sensor. When this occurs, the drain closes. Also, when sensor 73 switches high, it triggers the refill cycle to start, as discussed above. At this point SCR 81 is reset because the current path through its anode is now broken. Refilling stops when liquid level sensor 75 comes in contact with the fluid.

It should be noted that there are many modifications that can be added to the systems 60 and 70. For instance, system 60 can be allowed to operate only during daytime, i.e., when evaporation occurs. This is accomplished by mounting an inexpensive infrared detector facing the sky. The system therefore operates only when the detector senses the infrared light from the sun. Similar modifications can be made to system 70 to accommodate the dispensing of liquid without the need for mechanical float mechanisms, etc., or common flush/refill applications such as toilets.

While the invention has been particularly shown and described with reference to preferred embodiment(s) thereof, it will be understood by those skilled in the art that various changes in form and details may be made therein without departing from the spirit and scope of the invention.

What is claimed is:

1. A control system for a target system including first and second terminals, said second terminal of said target system coupled with a power source, said control system comprising:
   a resettable switch including an input coupled with said first terminal of said target system, an output of said switch coupled with a current source/sink; and
   a current sourcing/sinking device including an input and an output, said output of said current sourcing/sinking device coupled with said first terminal of said target system and said input of said switch;
   wherein a sensing of a first event activates said switch to thereby activate said target system by causing flow of current from said power source to said second terminal of said target system, through said target system and said switch;

wherein a sensing of a second event causes said output of said current sourcing/sinking device to draw current from said first terminal of said target system, thereby continuing the flow of current through said target system, the drawing of current by said output of said current sourcing/sinking device from said first terminal of said target system removing the flow of current through said switch thereby automatically resetting said switch while the target system remains activated.

2. The control system of claim 1, wherein a sensing of a third event inactivates said target system by causing said output of said current sourcing/sinking device to remove the current drawn from said first terminal of said target system, thereby removing the flow of current through said target system.

3. The control system of claim 2, wherein the removing of the flow of current through said target system automatically resets said target system.

4. The control system of claim 1, wherein said current sourcing/sinking device comprises a Schmitt device.

5. The control system of claim 4, wherein said Schmitt device comprises an Optoschmitt.

6. The control system of claim 1, wherein said switch comprises a thyristor or a silicon controlled rectifier resettable by the removal of current therethrough.

7. The control system of claim 1, wherein said power source comprises a first voltage source, wherein said target system comprises a relay, and a subsystem, said subsystem including first and second terminals;

said relay comprising said first terminal of said target system, said second terminal of said target system, a third terminal, and a fourth terminal; said third terminal of said relay coupled with a power source, said fourth terminal of said relay coupled with said first terminal of said subsystem.

8. The control system of claim 7, wherein said sensing of said first event changes state of said relay by causing flow of current from said power source to said second terminal of said relay, thereby causing flow of current from said first terminal of said relay to said input of said switch, thereby causing flow of current through said switch.

9. The control system of claim 8, wherein the changing of state of said relay changes state of said subsystem by causing flow of current from said power source to said third terminal of said relay or by removing flow of current from said power source to said third terminal of said relay;

wherein the flow of current from said power source to said third terminal of said relay causes flow of current from said fourth terminal of said relay to said first terminal of said subsystem, thereby causing flow of current from said second terminal of said subsystem, or wherein the removing of the flow of current from said power source to said first terminal of said relay removes flow of current from said fourth terminal of said relay to said first terminal of said subsystem, thereby removing flow of current from said second terminal of said subsystem.

10. The control system of claim 1, wherein said target system comprises a first target system, wherein said switch comprises a first switch, wherein said current sourcing/sinking device comprises a first current sourcing/sinking device, said control system for said first target system and a second target system including first and second terminals, said second terminal of said second target system coupled with a power source, the control system further comprising:

a second resettable switch including an input coupled with a first terminal of a second target system, an output of said second switch coupled with a current source/sink; and a second current sourcing/sinking device including an input and an output, said output of said current sourcing/sinking device coupled with said first terminal of said second target system and said input of said second switch;

wherein said sensing of said first event at said input of said sensor further activates said second switch to thereby activate said second target system by causing flow of current from said power source, through said second target system and said second switch;

wherein a sensing of a third event causes said output of said second current sourcing/sinking device to draw current from said first terminal of said second target system, thereby continuing the flow of current through said second target system, the drawing of current by said output of said second current sourcing/sinking device from said first terminal of said second target system removing the flow of current through said second switch thereby automatically resetting said second switch while the second target system remains activated.

11. The control system of claim 10, wherein:

a sensing of a fourth event inactivates said first target system by causing said output of said current sourcing/sinking device to remove the current drawn from said first terminal of said first target system, thereby removing the flow of current through said first target system; and a sensing of a fifth event inactivates said second target system by causing said output of said second current sourcing/sinking device to remove the current drawn from said first terminal of said second target system, thereby removing the flow of current through said second target system.

12. A method for resetting a switch resettable by the removal of current therefrom, the switch used to activate a target system by providing a first current path therefrom, comprising:

using a current sourcing/sinking device to supplant the first current path with an alternate current path thereby resetting the switch while maintaining activation of the target system.

13. The method of claim 12, wherein the target system is activated upon a first event, and the switch is reset by the current sourcing/sinking device upon a second event.

14. The method of claim 12, wherein the switch, current sourcing/sinking device, and a terminal of the target system are connected to a common node in the system.

15. The method of claim 12, wherein the current sourcing/sinking device comprises a Schmitt device and the switch comprises a thyristor or silicon controlled rectifier.

16. A control system for a target system requiring first and second levels to be activated, comprising:

a first sensor for providing the first level to the target system upon sensing a first event; and a resettable switch for providing the second level to the target system upon a second event to thereby activate the target system; and wherein the first sensor removes the first level upon sensing a third event thereby resetting the resettable switch.

17. The control system of claim 16, further comprising:

a second sensor for sensing the second event and activating the resettable switch to provide the second voltage level to the target system.

18. The control system of claim 16, wherein the first sensor comprises a Schmitt device.

19. The control system of claim 16, wherein the resettable switch comprises a thyristor or a silicon controlled rectifier resettable by the removable of current therethrough.

20. A method for activating a target system requiring first and second levels for activation, comprising:

upon sensing a first event, providing the first level to the target system;

upon sensing a second event, providing the second level to the target system through a resettable switch;

upon sensing a third event, removing the first level from the target system thereby resetting the resettable switch.

21. The method of claim 20, wherein a Schmitt device senses the first and third events and provides and removes the first level from the target system.

22. The method of claim 20, wherein the resettable switch comprises a thyristor or a silicon controlled rectifier resettable by the removal of current therethrough.

23. A control system for a target system including first and second terminals, said control system comprising:

a Schmitt device including an input and an output, said output of said Schmitt device coupled with said first terminal of said target system; and a power source coupled with said second terminal of said target system, said power source comprising a voltage source/ground;

wherein a sensing of a first event at said input of said Schmitt device activates said target system by causing said output of said Schmitt device to apply a current sink/source to said first terminal of said target system; and wherein sensing of a second event at said input of said Schmitt device inactivates said target system by causing said output of said Schmitt device to apply a current source/sink to said first terminal of said target system.

24. The control system of claim 23, wherein the Schmitt device comprises an Optoschmitt and the target system requires about 40 mA to activate.

25. The control system of claim 24, wherein the target system comprises a relay.

26. A method for operating a target system requiring a current path therethrough, comprising:

using a first state of a Schmitt device to source/sink said current path to activate said target system; and using a second state of said Schmitt device to sink/source said current path to deactivate said target system.

27. The method of claim 26, wherein the Schmitt device comprises an Optoschmitt and the target system requires about 40 mA to activate.

28. The method of claim 27, wherein the target system comprises a relay.

29. A first control system, comprising:

a first target device;

a first sensor for controlling a first resettable switch through which said first target device is activated; and a second sensor for deactivating said first target device, wherein the first resettable switch is reset by the second sensor deactivating the first target device.

30. The first control system of claim 29 in combination with a fluid tank, wherein:

the first target device comprises a fill device for filling the tank;

the first sensor senses a drained tank and activates the fill device to fill the tank by activating the resettable switch; and the second sensor senses a subsequent, filled tank and deactivates the fill device, thereby resetting the first resettable switch.

31. The combination of claim 30, in further combination with a second control system, the second control system including:

a drain device for draining the tank;

a third sensor for controlling a second resettable switch through which said drain device is activated to drain the tank;

wherein the first sensor deactivates the drain device upon a drained tank, and wherein the second resettable switch is reset by the first sensor deactivating the drain device upon a drained tank.

32. The combination of claim 31, wherein the first and second control systems are coupled to cooperatively drain then fill the tank, wherein the first sensor deactivates the drain device while activating the first resettable switch to fill the tank.

33. The combination of claim 31, wherein the first and second resettable switches comprise thyristors or silicon controlled rectifiers resettable by the removal of current therethrough.

34. The first control system of claim 29 in combination with a fluid tank, wherein:

the target device comprises a drain device for draining the tank;

the first sensor senses an indication to drain the tank and activates the drain device to drain the tank by activating the resettable switch; and the second sensor senses a subsequent, drained tank and deactivates the drain device, thereby resetting the first resettable switch.

35. The control system of claim 29, wherein the first resettable switch comprises a thyristor or silicon controlled rectifier resettable by the removal of current therethrough.

36. A method for controlling a target device, comprising:

upon sensing a first event, activating a first resettable switch through which the target device is activated; and upon sensing a second event, deactivating the target device thereby resetting the first resettable switch.

37. The method of claim 36 in combination with a method for filling a fluid tank, wherein:

the target device comprises a fill device for filling the tank;

the first event is a drained tank, upon which the fill device is activated to fill the tank by activating the first resettable switch; and the second event is a filled tank, upon which the fill device is deactivated, thereby resetting the first resettable switch.

38. The method combination of claim 37, in further combination with a method for draining the tank, comprising:

providing a drain device for draining the tank;

upon sensing an indication to drain the tank, activating a second resettable switch through which said drain device is activated to drain the tank; and upon thereafter sensing a drained tank, deactivating said drain device thereby resetting the second resettable switch.

39. The combination of claim 38, further comprising cooperatively draining then filling the tank including, upon sensing a drained tank after draining, deactivating the drain device while simultaneously activating the first resettable switch to fill the tank.

40. The combination of claim 38, wherein the first and second resettable switches comprise thyristors or silicon controlled rectifiers resettable by the removal of current therethrough.

41. The method of claim 36 in combination with a method for draining a fluid tank, wherein:

the target device comprises a drain device for draining the tank;

the first event is an indication to drain the tank, upon which the drain device is activated to drain the tank by activating the first resettable switch; and the second event is a drained tank, upon which the drain valve is deactivated, thereby resetting the first resettable switch.

42. The method of claim 36, wherein the first resettable switch comprises a thyristor or silicon controlled rectifier resettable by the removal of current therethrough.

* * * * *